(12) United States Patent
Okanobu

(10) Patent No.: US 7,944,268 B2
(45) Date of Patent: May 17, 2011

(54) SWITCH CIRCUIT, VARIABLE CAPACITOR CIRCUIT AND IC OF THE SAME

(75) Inventor: Taiwa Okanobu, Tokyo (JP)

(73) Assignee: Sony Corporation, Tokyo (JP)

( * ) Notice: Subject to any disclaimer, the term of this patent is extended or adjusted under 35 U.S.C. 154(b) by 37 days.

(21) Appl. No.: 12/521,085

(22) PCT Filed: Oct. 5, 2007

(86) PCT No.: PCT/JP2007/069598
§ 371 (c)(1),
(2), (4) Date: Jun. 24, 2009

(87) PCT Pub. No.: WO2008/078443
PCT Pub. Date: Jul. 3, 2008

(65) Prior Publication Data
US 2010/0085109 A1    Apr. 8, 2010

(30) Foreign Application Priority Data
Dec. 26, 2006  (JP) .................. 2006-349471

(51) Int. Cl.
*H03K 17/687* (2006.01)
(52) U.S. Cl. ....................... 327/434; 327/389
(58) Field of Classification Search .............. 327/389, 327/427, 434
See application file for complete search history.

(56) References Cited

U.S. PATENT DOCUMENTS

| | | | |
|---|---|---|---|
| 5,223,754 A * | 6/1993 | Decker et al. | 327/434 |
| 5,444,219 A * | 8/1995 | Kelly | 219/505 |
| 6,509,757 B1 | 1/2003 | Humphrey | |
| 6,889,036 B2 * | 5/2005 | Ballweber et al. | 455/292 |
| 7,710,181 B2 * | 5/2010 | Nakatani et al. | 327/308 |
| 2001/0040479 A1 | 11/2001 | Zhang | 327/427 |
| 2002/0113638 A1 * | 8/2002 | Takauchi et al. | 327/333 |
| 2004/0161868 A1 | 8/2004 | Hong | |
| 2004/0178467 A1 | 9/2004 | Lyon et al. | |
| 2004/0263234 A1 * | 12/2004 | Mason | 327/334 |
| 2005/0014473 A1 | 1/2005 | Zhao et al. | |
| 2005/0035807 A1 * | 2/2005 | Kondou et al. | 327/333 |
| 2005/0040909 A1 | 2/2005 | Waight et al. | |
| 2005/0174184 A1 * | 8/2005 | Wu | 331/176 |

(Continued)

FOREIGN PATENT DOCUMENTS

JP          08-223020          8/1996

(Continued)

OTHER PUBLICATIONS

European Patent Office, European Search Report issued for patent application EP 10001328.3, on Sep. 3, 2010.

(Continued)

*Primary Examiner* — Thomas J Hiltunen
(74) *Attorney, Agent, or Firm* — SNR Denton US LLP

(57) ABSTRACT

A first terminal T1 is connected to the drain (or the source) of a MOS-FET (Q11), whose back gate is separated, through a capacitor C11. The MOS-FET (Q11) is connected at the source (or the drain) thereof to a second terminal T2. The back gate is connected to the source (or the drain). A control voltage VG is supplied to the gate of the MOS-FET (Q11), and a voltage having a polarity reversed from that of this control voltage VG is supplied to the drain through a resistance element R12.

7 Claims, 10 Drawing Sheets

U.S. PATENT DOCUMENTS

| | | | |
|---|---|---|---|
| 2005/0212614 A1* | 9/2005 | Peluso | 331/177 V |
| 2006/0267666 A1 | 11/2006 | Toda | |
| 2007/0218613 A1 | 9/2007 | Lee et al. | |
| 2008/0185619 A1 | 8/2008 | Merrill | |
| 2009/0045321 A1 | 2/2009 | Bae et al. | |
| 2009/0289692 A1* | 11/2009 | Chen | 327/434 |

FOREIGN PATENT DOCUMENTS

| | | |
|---|---|---|
| JP | 10-284714 A | 10/1998 |
| JP | 2002-314388 | 10/2002 |
| WO | 02/27804 A2 | 4/2002 |
| WO | 2005/119791 A1 | 12/2005 |
| WO | 2006/053916 A2 | 5/2006 |

OTHER PUBLICATIONS

European Patent Office, European Search Report issued for patent application EP 07829336.2, on Sep. 9, 2010.

European Patent Office, Office Action issued in patent application EP 10001328.3, on Sep. 20, 2010.

* cited by examiner

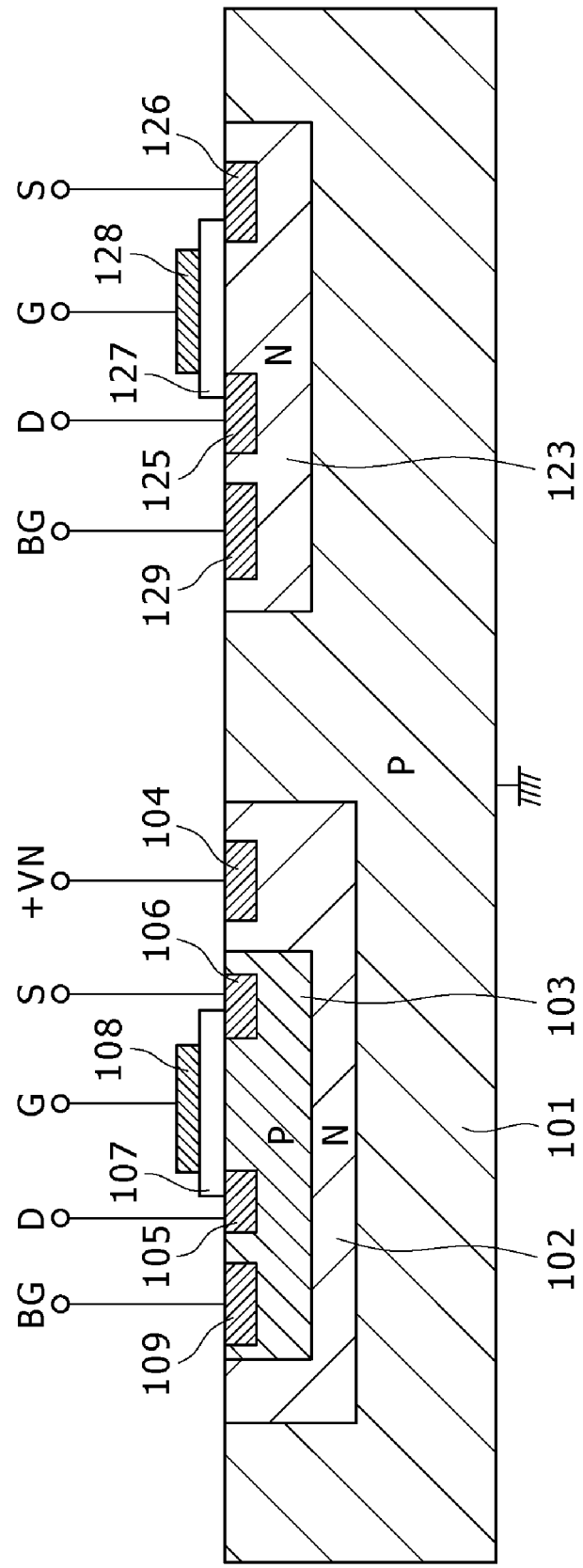

SWITCH CIRCUIT, VARIABLE CAPACITOR CIRCUIT AND IC OF THE SAME

TECHNICAL FIELD

This invention relates to a switch circuit, a variable capacitor circuit and an IC of the same.

BACKGROUND ART

As a switch circuit which uses a MOS-FET, a circuit shown in FIG. 10 or 11 is known. In particular, in the circuit of FIG. 10, when a gate voltage VG of an N-channel MOS-FET (QSW) is approximately 4 to 5 V, the source-drain path of the MOS-FET (QSW) becomes on, but when the gate voltage VG is 0, the source-drain path becomes off.

Meanwhile, also the circuit of FIG. 11 is similar, and when VG=approximately 6 V, the source-drain path of the MOS-FET (QSW) becomes on, but when VG=0, the source-drain path of the MOS-FET (QSW) becomes off. Accordingly, each of those circuits operates as a switch circuit which is controlled with the gate voltage VG.

Patent Document 1: Japanese Patent Laid-Open No. Hei 8-223020
Patent Document 2: Japanese Patent Laid-Open No. 2002-314388

DISCLOSURE OF INVENTION

Technical Problem

However, in the case of the switch circuit of FIG. 10, it is necessary to apply a negative potential (in FIG. 10, −3 V) to the back gate of the FET (QWS), and if the negative potential is not applied, then when an input signal of a great amplitude is supplied, the PN junction between the source and drain and the back gate is forwardly biased with the input signal and is rendered conducting, resulting in generation of distortion.

Further, where an IC is formed, a negative voltage for the back gate is not obtained occasionally, and in this instance, it is necessary to bias the source and the drain in the forward direction from the ground potential to set the back gate to a relatively negative potential. As a result, it is necessary to set the gate voltage when the FET (QSW) is to be turned on to a higher voltage, and where there is a limitation to the power supply voltage, the switch circuit cannot be used readily.

Further, when a signal of a great amplitude flows, since the fluctuation of the bias voltage between the source and drain and the gate becomes great, also the on resistance of the FET (QSW) varies by a great amount, resulting in generation of distortion. Accordingly, it is necessary to use an FET having low on resistance. However, to this end, it is necessary to use an FET having a great size, and as a result, the capacitance parasitic to the drain or the source becomes high, and accordingly, the impedance decreases. This makes a problem when an input signal is distributed to a plurality of circuits, particularly when a high frequency signal is distributed.

In this regard, the switch circuit of FIG. 11 does not require a negative voltage. Further, the PN junction between the source and the back gate is interposed between the input and the output, and when the FET (QSW) is on, since the PN junction is shunted by the on resistance, no problem occurs when the FET (QSW) is on.

However, when the FET (QSW) is turned off, since the PN junction is placed into a zero bias state, if an input signal of a large amplitude is supplied, then due to the PN junction, a rectification operation is carried out through a coupling capacitor Cin for every negative cycle, resulting in distortion of the input signal. In this instance, since the FET (QSW) is off, although the distortion has nothing to do with the output of the FET (QSW), an input signal supplied to the different switch circuit is distorted unfavorably.

The present invention contemplates solution to such problems as described above.

Technical Solution

According to the present invention, there is provided a switch circuit, wherein:

a first terminal is connected to the drain (or the source) of a MOS-FET, whose back gate is separated, through a capacitor;

the MOS-FET is connected at the source (or the drain) thereof to a second terminal;

the back gate is connected to the source (or the drain);

a control voltage is supplied to the gate of the MOS-FET; and a voltage having a polarity reversed from that of the control voltage is supplied to the drain through a resistance element.

Advantageous Effect

With the present invention, there is no necessity for a negative bias voltage, and there is no necessity to bias the drain or source of the FET in the forward direction from the ground potential to set the back gate to a relatively negative potential either. Further, operation with a low potential can be anticipated.

BRIEF DESCRIPTION OF DRAWINGS

FIG. 5A is a sectional view (part 1) of an IC for explaining the circuits of FIGS. 4A to 4C.

BEST MODE FOR CARRYING OUT THE INVENTION

Here, a television receiver in which a switch circuit according to the present invention is suitably used is described first.

[1] EXAMPLE OF THE (ENTIRE) RECEPTION CIRCUIT

Frequencies (channels) used for television broadcasting differ among different countries, and also for the color television system, NTSC, PAL, SECAM and so forth are available. Further, not only analog broadcasts but also digital broadcasts are available.

Thus, it seems a possible idea to divide a reception signal system of a television broadcast into a front end circuit which receives a television broadcast and outputs an intermediate frequency signal, and a base band processing circuit which processes an output of the front end circuit and outputs a color image signal and a sound signal. In short, it is intended to cope with a difference in the broadcasting system of a television broadcast by such countermeasure.

Therefore, an example of a front end circuit and a base band processing circuit to which the present invention can be applied are described.

[1-1] Example of the Front End Circuit

Figure 1:
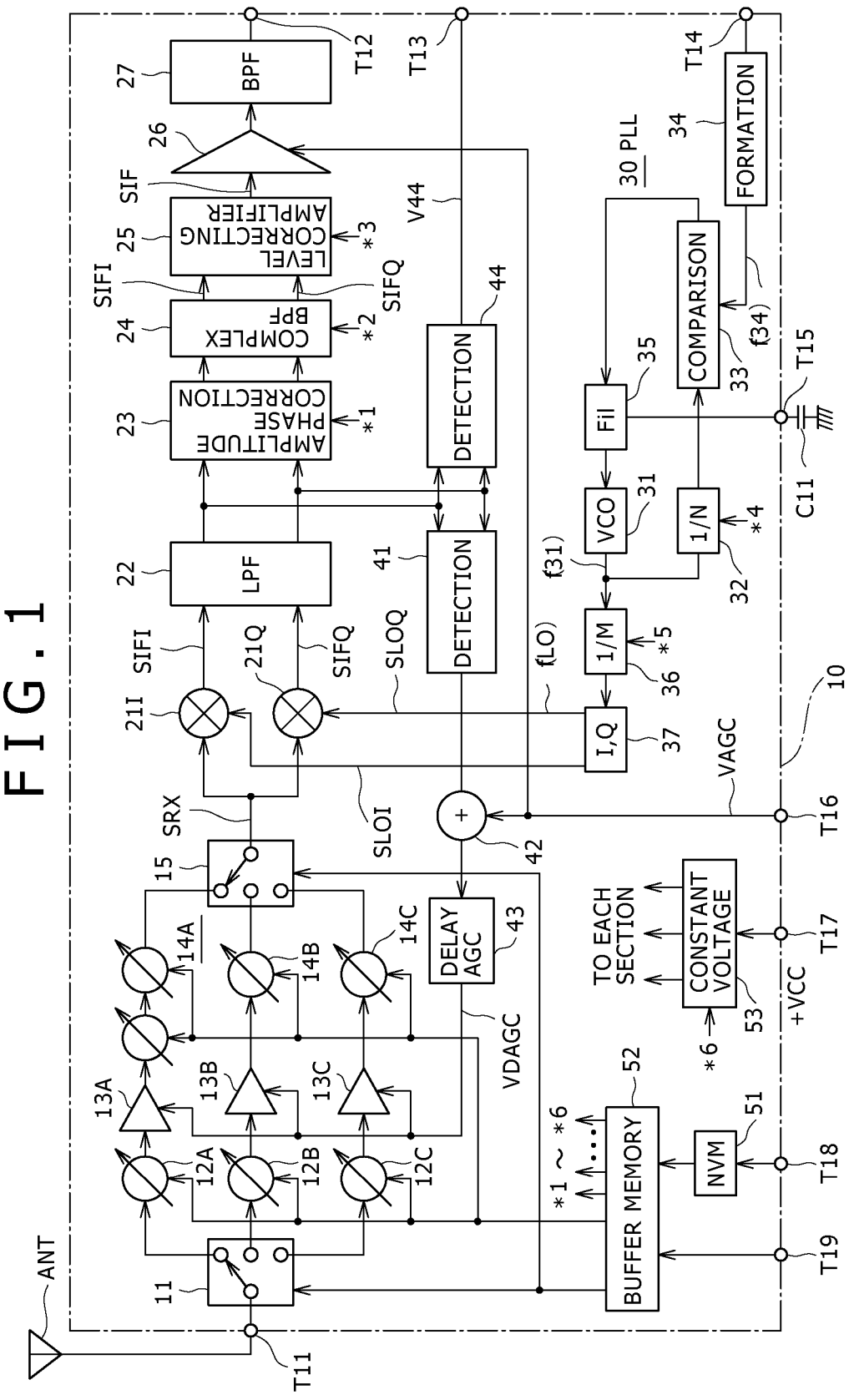
FIG. 1 is a system diagram showing a form of a front end circuit.

FIG. 1 shows an example of a front end circuit which can receive television broadcasts of different countries irrespective of the broadcasting form. In the present example, frequencies used in television broadcasts in different countries are divided into three bands of (A) 46 to 147 MHz (VL band)
(B) 147 to 401 MHz (VH band) and
(C) 401 to 887 MHz (U band)

and, in each of the reception bands, the frequency can be changed in accordance with an object channel.

In particular, referring to FIG. 1, a portion 10 surrounded by a chain line denotes the front end circuit, and this is formed an IC in the form of a 1-chip IC. Further, this IC (front end circuit) 10 has terminal pins T11 to T19 for external connection.

Broadcasting wave signals of television broadcasts are received by an antenna ANT, and reception signals of them are selectively supplied from the terminal pin T11 to the antenna tuning circuits 12A to 12C through a switch circuit 11. In this instance, the antenna tuning circuits 12A to 12C correspond to the reception bands of the items (A) to (C) above, respectively, and are configured such that the capacitance of a tuning capacitor is changed with digital data to change the tuning frequency, and as a result, tuning with a reception signal of an object frequency (channel) is carried out. It is to be noted that details are hereafter described.

The reception signals of the antenna tuning circuits 12A to 12C are supplied to a switch circuit 15 through high frequency amplifiers 13A to 13C and further through interstage tuning circuits 14A to 14C. The switch circuit 15 is changed over in an interlocked relationship with the switch circuit 11, and accordingly, a reception signal SRX of an object reception band is extracted from the switch circuit 15. The extracted reception signal SRX is supplied to mixer circuits 21I and 21Q.

It is to be noted that, while also the tuning circuits 14A to 14C are configured similarly to the tuning circuits 12A to 12C, the tuning circuit 14A is formed as a double tuning circuit. Further, as hereinafter described, the tuning capacitors of the tuning circuits 12A to 14C are built in the IC 10 while tuning coils are externally connected to the IC 10.

Further, an oscillation signal of a predetermined frequency is formed by a VCO 31. This VCO 31 is for forming a local oscillation signal and forms part of a PLL 30. In particular, the oscillation signal of the VCO 31 is supplied to a variable dividing circuit 32, by which it is divided into a signal of a frequency of 1/N (N is a positive integer), and this divided signal is supplied as a reference signal to a phase comparison circuit 33. Further, a clock (whose frequency is approximately 1 to 2 MHz) is supplied from the outside to a signal formation circuit 34 through the terminal pin T14, and the clock is divided into a signal of a predetermined frequency f34 by the signal formation circuit 34. This frequency signal is supplied as a reference signal to the phase comparison circuit 33.

And, a comparison output of the phase comparison circuit 33 is supplied to a loop filter 35, from which a dc voltage whose level varies in accordance with a phase difference between an output signal of the variable dividing circuit 32 and an output signal of the signal formation circuit 34. This dc voltage is supplied as a control voltage for an oscillation frequency f31 to the VCO 31. It is to be noted that a smoothing capacitor C11 is externally connected to the filter 35 through the terminal pin T15.

Accordingly, since the oscillation frequency f31 of the VCO 31 becomes $$f31 = N \cdot f34 \quad (1)$$

if the dividing ration N is controlled by a microcomputer (not shown) for system control, then the oscillation frequency f31 of the VCO 31 can be varied. For example, the frequency f31 is 1.8 to 3.6 GHz in response to the reception band and the reception frequency (reception channel).

Then, the oscillation signal of the VCO 31 is supplied to a variable dividing circuit 36, by which it is divided to 1/M (for example, M=2, 4, 8, 16, 32), and this divided signal is supplied to a dividing circuit 37, by which it is divided into division signals SLOI and SLOQ which have a frequency of ½ and have phases orthogonal to each other. The signals SLOI and SLOQ are supplied as local oscillation signals to mixer circuits 21I and 21Q.

Here, if
fLO: frequency of the local oscillation signals SLOI and SLOQ
then $$fLO = f31/(2M) \quad (2)$$
$$= N \cdot f34/(2M)$$
$$= f34 \cdot N/(2M)$$

Accordingly, by changing the dividing ratio M, N, the local oscillation frequency fLO can be varied by a predetermined frequency step over a wide range.

Further, it is assumed that
SRX: reception signal desired to be received
SUD: image interfering signal
and, for the simplification, $$SRX = ERX \cdot \sin \omega RXt$$

ERX: amplitude of the reception signal SRX
ωRX=2πfRX
fRX: center frequency of the reception signal SRX $$SUD = EUD \cdot \sin \omega UDt$$

EUD: amplitude of the image interfering signal SUD
ωUD=2πfUD
fUD: center frequency of the image interfering signal SUD
Further, regarding the local oscillation signals SLOI and SLOQ, $$SLOI = ELO \cdot \sin \omega LOt$$

$$SLOQ = ELO \cdot \cos \omega LOt$$

ELO: amplitude of the signals SLOI and SLOQ
ωLO=2πfLO
However, if, in this instance, $$\omega IF = 2\pi fIF$$

fIF: intermediate frequency. For example, 4 to 5.5 MHz (changed in accordance with the broadcasting system) then, in the case of the upper heterodyne, $$fRX = fLO - fIF$$

$$fUD = fLO + fIF$$

Accordingly, such signals SIFI and SIFQ as given below are outputted from the mixer circuits 21I and 21Q. In particular, signals of SIFI and SIFQ, $$\begin{aligned}SIFI &= (SRX + SUD) \times SLOI \\ &= ERX \cdot \sin\omega RXt \times ELO \cdot \sin\omega LOt + \\ &\quad EUD \cdot \sin\omega UDt \times ELO \cdot \sin\omega LOt \\ &= \alpha\{\cos(\omega RX - \omega LO)t - \cos(\omega RX + \omega LO)t\} + \\ &\quad \beta\{\cos(\omega UD - \omega LO)t - \cos(\omega UD + \omega LO)t\}\end{aligned}$$

$$\begin{aligned}SIFQ &= (SRX + SUD) \times SLOQ \\ &= ERX \cdot \sin\omega RXt \times ELO \cdot \cos\omega LOt + \\ &\quad EUD \cdot \sin\omega UDt \times ELO \cdot \cos\omega LOt \\ &= \alpha\{\sin(\omega RX + \omega LO)t + \sin(\omega RX - \omega LO)t\} + \\ &\quad \beta\{\sin(\omega UD - \omega LO)t - \sin(\omega UD - \omega LO)t\}\end{aligned}$$

$$\alpha = ERX \cdot ELO / 2$$
$$\beta = EUD \cdot ELO / 2$$

are extracted.

The signals SIFI and SIFQ are supplied to a low-pass filter 22 which has a wide band in comparison with an occupation bandwidth (for example, 6 to 8 MHz) of the image intermediate frequency and the sound intermediate frequency. As a result, the low-pass filter 22 removes the signal components of the sum angular frequencies (ωRX+ωLO) and (ωUD+ωLO) (and the local frequency signals SLOI and SLOQ), and $$SIFI = \alpha \cdot \cos(\omega RX - \omega LO)t + \beta \cdot \cos(\omega UD - \omega LO)t \quad (3)$$
$$= \alpha \cdot \cos\omega IFt + \beta \cdot \cos\omega IFt$$

$$SIFQ = \alpha \cdot \sin(\omega RX - \omega LO)t + \beta \cdot \sin(\omega UD - \omega LO)t \quad (4)$$
$$= -\alpha \cdot \sin\omega IFt + \beta \cdot \sin\omega IFt$$

are extracted from the low-pass filter 22.

Then, the signals SIFI and SIFQ are supplied to a complex band-pass filter (polyphase band-pass filter) 24 through an amplitude phase correction circuit 23 hereinafter described. This complex band-pass filter 24 has characteristics that (a) it has a frequency characteristic of a band-pass filter; that (b) it has a phase shift characteristic as well and shifts the phase of the signal SIFI by a value φ (φ is an arbitrary value); that (c) it similarly shifts the phase of the signal SIFQ by another value (φ−90°; and that (d) it has two band-pass characteristics having center frequencies at a frequency f0 and another frequency −f0 which are symmetrical with each other with respect to the zero frequency and can select them in accordance with a relative phase of the input signals.

Accordingly, the complex band-pass filter 24 delays the phase of the signal SIFQ by 90° with respect to the signal SIFI based on the items (b) and (c) to $$SIFI = \alpha \cdot \cos\omega IFt + \beta \cdot \cos\omega IFt \quad (5)$$

$$SIFQ = -\alpha \cdot \sin(\omega IFt - 90°) + \beta \cdot \sin(\omega IFt - 90°) \quad (6)$$
$$= \alpha \cdot \cos\omega IFt - \beta \cdot \cos\omega IFt$$

In short, between the signal SIFI and the signal SIFQ, the signal components α·cos ωIFt have the same phase while the signal components β·cosωIFt have the opposite phases to each other.

Then, the signals SIFI and SIFQ are supplied to a level correcting amplifier 25, by which the signal SIFI and the signal SIFQ are added, and such a signal SIF as given below is extracted from the level correcting amplifier 25.

In particular, $$SIF = SIFI + SIFQ \quad (7)$$
$$= 2\alpha \cdot \cos\omega IFt$$
$$= ERX \cdot ELO \cdot \cos\omega IFt$$

is extracted. This extracted signal SIF is nothing but an intermediate frequency when the reception signal SRX is received by the upper heterodyne system. And, this intermediate frequency signal SIF does not include the image interfering signal SUD. It is to be noted that the amplitude phase correction circuit 23 corrects the amplitude and the phase of the signals SIFI and SIFQ so that the expression (7) is satisfied sufficiently, that is, so that the image interfering signal SUD may be minimized.

Further, at this time, the level correcting amplifier 25 corrects the level of the signal SIF so that, even if the level of the signals SIFI and SIFQ differs depending upon the difference of the broadcasting system, an AGC characteristic (particularly a starting level of the AGC) hereinafter described may not change.

Then, this intermediate frequency signal SIF is outputted to the terminal pin T12 through a variable gain amplifier 26 for AGC and further through a band-pass filter 27 for cutting of a dc component and for aliasing.

Accordingly, if the dividing ratio M, N is changed, then an object frequency (channel) can be selected in accordance with the expression (2), and if the intermediate frequency signal SIF outputted to the terminal pin T12 is demodulated in accordance with the broadcasting system, then an object broadcast can be enjoyed.

In this manner, according to the present front end circuit 10, the wide frequency range of 46 to 887 MHz can be coped with using a one-chip IC. Further, the front end circuit 10 can be implemented with a reduced number of parts without deteriorating the disturbance characteristic over a wide frequency range. Furthermore, the single front end circuit 10 can cope with the difference in the broadcasting system between digital broadcasting and analog broadcasting or with the difference of the broadcasting system depending upon the area in the world.

Further, the reception disturbance by harmonics of a clock signal is reduced, and as a result, the reception sensitivity is enhanced. Further, since all circuit parts of the PLL 30 can be formed on a chip except the capacitor C11, it can be formed as a PLL which is tough against disturbance and little suffers from occurrence of disturbance. Further, since only the tuning circuits 14A to 14C are connected to the high frequency amplifiers 13A to 13C, respectively, the load is light and the high frequency amplifiers 13A to 13C have a low distortion feature.

[1-1-1] Example of the AGC

An AGC voltage VAGC is formed by a base-band processing circuit hereinafter described, and this AGC voltage VAGC is supplied as a control signal for the gain of the variable gain amplifier 26 for AGC to the variable gain amplifier 26 for AGC through a terminal pin T16. Consequently, ordinary AGC is carried out.

Further, for example, where the level of the object reception signal SRX is excessively high or the reception signal SRX has a disturbance wave signal of a high level mixed therein, the ordinary AGC cannot cope with this. Therefore, the signals SIFI and SIFQ outputted from the low-pass filter 22 are supplied to a level detection circuit 41, by which it is detected whether or not the level of the signals SIFI and SIFQ before the AGC is carried out by the variable gain amplifier 26 exceeds a predetermined value. And, this detection signal and the AGC voltage VAGC of the terminal pin T16 are supplied to an addition circuit 42, and an addition output of the addition circuit 42 is supplied to a forming circuit 43, by which a delay AGC voltage VDAGC is formed. This delay AGC voltage VDAGC is supplied as a gain control signal to the high frequency amplifiers 13A to 13C to carry out delay AGC.

Accordingly, since optimum AGC operation can be carried out from the D/U between the strength of the desired reception signal and the strength of many signals whose reception is not desired, a desired broadcast can be received favorably from among digital broadcasts and analog broadcasts or even if they are mixed with each other.

[1-1-2] Example of the Voltages for Testing·Adjustment

The signals SIFI and SIFQ outputted from the low-pass filter 22 are supplied to and detected and smoothed by a linear detection circuit 44 to form a dc voltage V44 indicative of the level of the signals SIFI and SIFQ, and this voltage V44 is outputted to the terminal pin T13.

The dc voltage V44 outputted to the terminal pin T13 is used upon testing or adjustment of the front end circuit 10. For example, the dc voltage V44 can be used to check the level of an input signal (reception signal) over a wide frequency range. In particular, different from an output passed through an intermediate frequency filter of a narrow band, the dc voltage V44 can be used to directly check the attenuation characteristic over a wide band regarding signal lines from the antenna terminal pin T11 to the mixer circuits 21I and 21Q.

On the other hand, when the antenna tuning circuits 12A to 12C and the interstage tuning circuits 14A to 14C are to be adjusted, if an input test signal is applied to the terminal pin T11 and the AGC voltage VAGC to be applied to the terminal pin T16 is fixed to a predetermined value, then tracking adjustment can be carried out from a variation of the dc voltage V44. Further, adjustment of functions and measurement of a characteristic of the front end circuit 10 can be carried out with digital data to carry out automatic adjustment and automatic measurement.

[1-1-3] Constant Voltage Circuit

The IC 10 includes a constant voltage circuit 53, to which a power supply voltage +VCC is supplied from the terminal pin T17. This constant voltage circuit 53 utilizes a band gap of the PN junction to form a fixed voltage of a predetermined value from a power supply voltage +Vcc, and the formed fixed voltage is supplied to the individual circuits of the IC 10. It is to be noted that the output voltage of the constant voltage circuit 53 can be adjusted finely.

Accordingly, even where the circuits are formed from MOS-FETs, the voltage to be supplied to the circuits can be set rather high, and the performance of the MOS-FETs can be extracted to the utmost.

[1-1-4] Initialization

Since the correction amount of the amplitude phase correction circuit 23, the center frequency and the passband width of the complex band-pass filter 24 and the gain of the level correcting amplifier 25 need conform with a broadcasting system of a television broadcast to be received, they are variable and can be set from the outside. For example, the center frequency of the complex band-pass filter 24 is variable within a range of 3.8 to 5.5 MHz and the passband of the complex band-pass filter 24 is variable within a range of 5.7 to 8 MHz.

And, upon assembly, upon shipment from a factory or in a like case, the preset values of the circuits 23 to 25 are written from the terminal pin T18 into a nonvolatile memory 51. Further, also data for tracking of the tuning circuits 12A to 12C and 14A to 14C (data for fine adjustment of the tuning frequency) and data for adjustment of the output voltage of the constant voltage circuit 53 are written similarly from the terminal pin T18 into the nonvolatile memory 51. Accordingly, the characteristic of the individual circuits can be set to that ready for the broadcasting system of a television broadcast to be received.

[1-1-5] Operation upon Use

Also when the power supply to the receiver which uses this IC 10 is powered on, the preset values of the nonvolatile memory 51 are copied into a buffer memory 52, and the copied preset values are supplied individually as default values into the circuits 12A to 12C, 14A to 14C, 23 to 25 and 53.

Then, if the user selects a channel, then data thereof is supplied to and stored once into the buffer memory 52 from a microcomputer (not shown) for system control through the terminal pin T19, and the stored data are supplied to the switch circuits 11 and 15, tuning circuits 12A to 12C, 14A to 14C and variable dividing circuits 32 and 36. Consequently, a reception band including an object channel (frequency) is selected, and the object channel is selected in the selected reception band.

[1-1-6] Summary

With the front end circuit 10 shown in FIG. 1, television broadcasts in the frequency band of 46 to 887 MHz as indicated by the items (A) to (C) can be received. Then, at this time, since the center frequency and the pass-band width of the complex band-pass filter 24 are variable, the front end circuit 10 can cope not only with ground wave digital television broadcasts and ground wave analog television broadcasts in Japan but also with digital television broadcasts and analog television broadcasts outside Japan.

[1-2] Example of the Base-Band Processing Circuit

Figure 2:
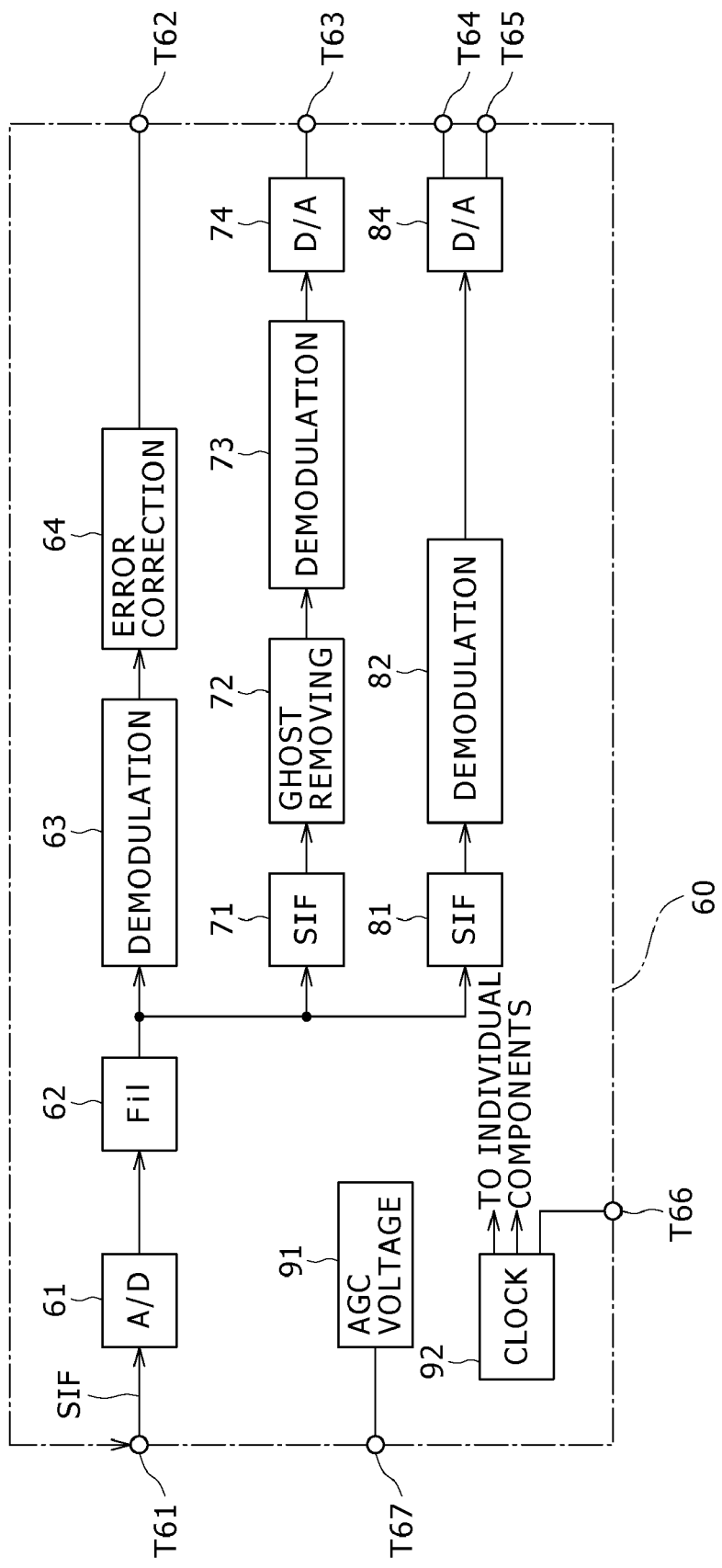
FIG. 2 is a system diagram showing a form of a base band processing circuit which can be connected to the circuit of FIG. 1.

FIG. 2 shows an example of the base-band processing circuit, and this is for processing the intermediate frequency signal SIF outputted from the front end circuit 10 to output a color image signal and a sound signal. In particular, referring to FIG. 2, a portion 60 surrounded by a chain line indicates the base-band processing circuit, which is formed as an IC in the form of a 1-chip IC. Further, the IC (base band processing circuit) 60 has terminal pins T61 to T67 for external connection.

And, the intermediate frequency signal SIF outputted from the terminal pin T12 of the front end circuit 10 is supplied from the terminal pin T61 to an A/D converter circuit 61, by which it is A/D converted into a digital intermediate frequency signal. From this digital intermediate frequency signal SIF, unnecessary frequency components are removed by a filter 62.

Then, upon reception of a digital television broadcast, the digital intermediate frequency signal SIF from the filter 62 is supplied to a demodulation circuit 63, by which a digital signal of the base band is demodulated and extracted. This demodulation output is supplied to an error correction circuit 64, by which it is converted into an error-corrected data stream. This data stream is outputted to the terminal pin T62. Accordingly, if the signal of the terminal pin T62 is decoded in accordance with the broadcasting system thereof, then the original color image signal and sound signal can be obtained.

On the other hand, upon reception of an analog television broadcast, the digital intermediate frequency signal SIF from the filter 62 is supplied to an image intermediate frequency filter 71, by which a digital image intermediate frequency signal is extracted. This signal is supplied, after ghost components are removed therefrom by a ghost removing circuit 72, to a demodulation circuit 73, by which a digital color image signal is demodulated. Then, this digital signal is supplied to a D/A converter circuit 74, by which it is D/A converted into an analog color image signal, and this color image signal is outputted to the terminal pin T63.

Further, upon reception of an analog television broadcast, the digital intermediate frequency signal SIF from the filter 62 is supplied to a sound intermediate frequency filter 81, by which a digital sound intermediate frequency signal is extracted. This signal is supplied to a demodulation circuit 82, by which a digital sound signal is demodulated. Then, this digital sound signal is supplied to a D/A converter circuit 84, by which it is D/A converted into sound signals of the left and right channels. Those sound signals are outputted to the terminal pins T64 and T65.

Further, an AGC voltage VAGC is formed by an AGC voltage forming circuit 91, and this AGC voltage VAGC is outputted to the terminal pin T67 and supplied to the terminal pin T16 of the front end circuit 10. Consequently, ordinal AGC and delay AGC are carried out as described hereinabove.

Further, a clock forming circuit 92 forms a clock of a predetermined frequency, and this clock is supplied to the components of the base band processing circuit 60 and is supplied to the signal formation circuit 34 through the terminal pin T66 and further through the terminal pin T14 of the front end circuit 10.

Accordingly, the reception disturbance by harmonics of the clock signal and so forth is reduced, and as a result, the reception sensitivity is enhanced.

[2] PARTICULAR EXAMPLE OF THE HIGH FREQUENCY STAGE

Figure 3:
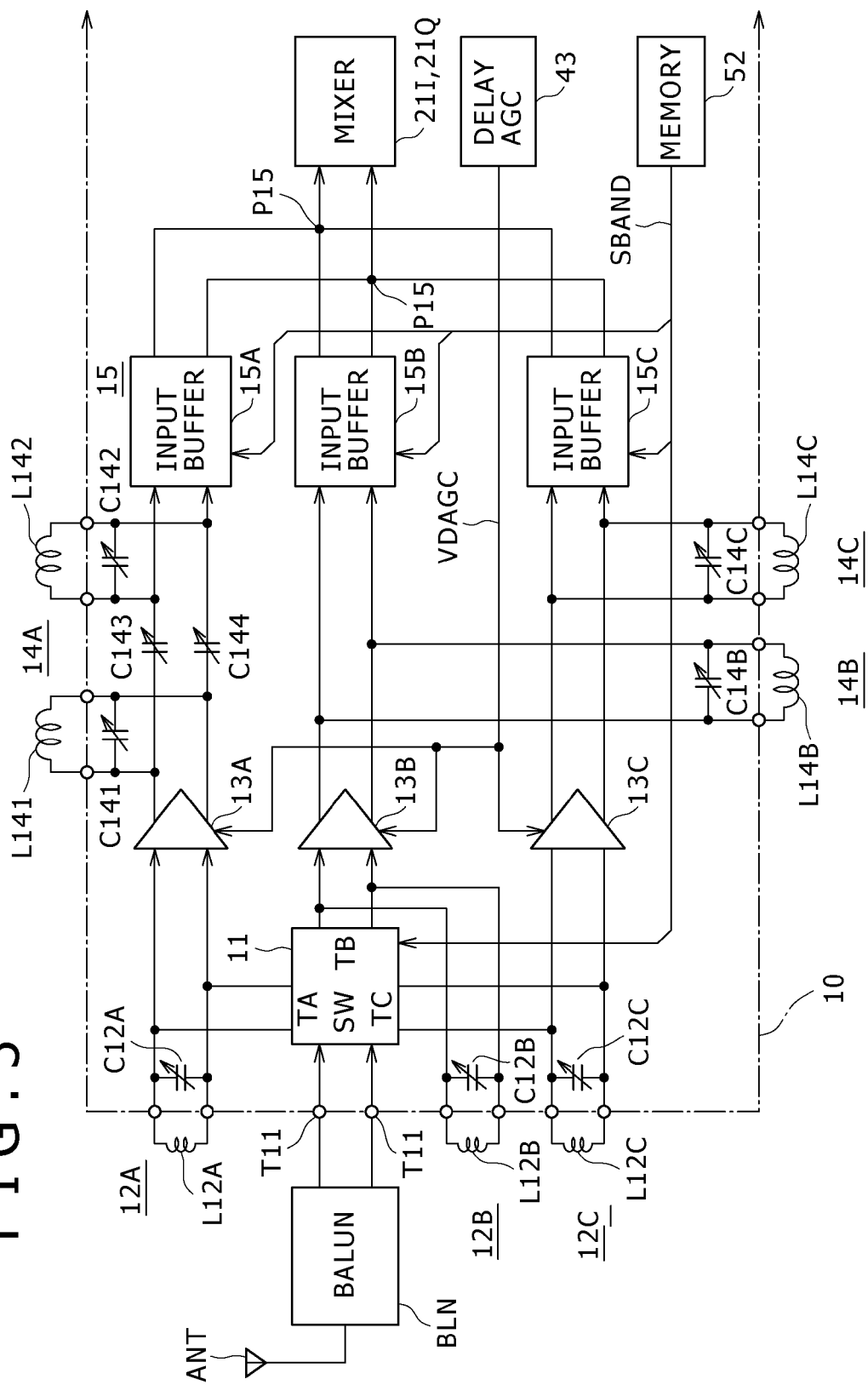
FIG. 3 is a connection diagram showing a form of a high frequency stage of the front end circuit.

FIG. 3 shows an example of a high frequency signal system from the switch circuit 11 to the switch circuit 15 of the front end circuit 10. It is to be noted that also this high frequency signal system is formed as that of the balance type.

In particular, reception signals of the antenna ANT are supplied to the switch circuit 11 through the terminal pins T11, T11 after they are converted into balanced reception signals by a balun BLN. Although a particular example is hereinafter described, this switch circuit 11 is formed equivalently as seen in FIG. 1 and selectively supplies reception signals supplied thereto through the terminal pins T11, T11 to the antenna tuning circuits 12A to 12C.

To this end, the switch circuit 11 is connected at first output terminals TA thereof to input terminals of the high frequency amplifier 13A, and the antenna tuning circuit 12A is connected in parallel to signal lines between the first output terminals TA of the switch circuit 11 and the input terminals of the high frequency amplifier 13A. In this instance, the tuning circuit 12A is formed such that a tuning coil L12A is externally connected to the IC 10 through terminals pin and a tuning capacitor C12A is built in the IC 10. It is to be noted that the capacitance of the capacitor C12A is changed with digital data to change the tuning frequency as hereinafter described.

Further, output terminals of the high frequency amplifier 13A are connected to input terminals of the input buffer circuit 15A through tuning capacitors C143 and C144, and a tuning coil L141 and a tuning capacitor C141 are connected in parallel to the output terminals of the high frequency amplifier 13A. Meanwhile, a tuning coil L142 and a tuning capacitor C142 are connected in parallel to input terminals of the input buffer circuit 15A. Thus, the interstage tuning circuit 14A is formed in a double tuning form.

It is to be noted that, at this time, the coils L141 and L142 are externally connected to the IC 10 through terminal pins. Further, the capacitors C141 to C144 are built in the IC 10, and the capacitance of them is changed with digital data to vary the tuning frequency. A high frequency stage of the VL band indicated in the item (A) is formed in this manner.

Meanwhile, second output terminals TB of the switch circuit 11 are connected to input terminals of the high frequency amplifier 13B, and the antenna tuning circuit 12B is connected in parallel to signal lines between the second output terminals TB of the switch circuit 11 and input terminals of the high frequency amplifier 13B.

Further, output terminals of the high frequency amplifier 13B are connected to input terminals of the input buffer circuit 15B, and a tuning coil L14B and a tuning capacitor C14B are connected in parallel to signal lines between the output terminals of the high frequency amplifier 13B and the input terminals of the input buffer circuit 15B to form the interstage tuning circuit 14B. It is to be noted that, at this time, the coils L12B and L14B are externally connected to the IC 10 through terminal pins while the capacitors C12B and C14B are built in the IC 10 and the capacitance thereof is changed with digital data to vary the tuning frequency. A high frequency stage of the VH band indicated in the item (B) is formed in this manner.

Further, third output terminals TC of the switch circuit 11 are connected to input terminals of the input buffer circuit 15C through the high frequency amplifier 13C, and the input terminal antenna tuning circuit 12C of the high frequency amplifier 13C is connected in parallel while the interstage tuning circuit 14C is connected in parallel to the input terminals of the input buffer circuit 14C. In this instance, the tuning circuit 12C is configured such that a tuning coil L12C is externally connected to the IC 10 through terminal pins while a tuning capacitor C12C is built in the IC 10. Meanwhile, the tuning circuit 14C is configured such that a tuning coil L14C is externally connected to the IC 10 through terminal pins while a tuning capacitor C14C is built in the IC 10. A high frequency stage of the U band indicated in the item (C) is formed in this manner.

Then, output terminals of the input buffer circuits 15A to 15C are connected commonly to nodes P15, P15 and connected to input terminals of the mixer circuits 21I and 21Q. Further, the delay AGC voltage VDAGC is supplied from the forming circuit 43 to the high frequency amplifiers 13A to 13C.

Further, a reception band switching signal SBAND is supplied from the buffer memory 52 to the switch circuit 11, and this switching signal SBAND is supplied as a control signal for permission/inhibition of operation of the input buffer circuits 15A to 15C to the input buffer circuits 15A to 15C so that the input buffer circuits 15A to 15C are controlled in an interlocking relationship with the switching of the switch circuit 11. In short, the switch circuit 15 is formed from the input buffer circuits 15A to 15C.

With such a configuration as describe above, for example, where reception of the VL band indicated in the item (A) is selected with the switching signal SBAND, reception signals are supplied from the switch circuit 11 to the tuning circuit 12A and operation of the input buffer circuit 15A is permitted. However, the reception signals are not supplied to the tuning circuits 12B and 12C and besides operation of the input buffer circuits 15B and 15C is inhibited.

Accordingly, reception of the VL band indicated in the item (A) is permitted, and a channel (frequency) selected by the tuning circuits 12A and 14A is outputted to the nodes P15, P15 and supplied to the mixer circuits 21I and 21Q. And, similar operation is carried out also with regard to the reception bands of the items (B) and (C).

In this manner, with the high frequency stage shown in FIG. 3, a reception band of the item (A) to (C) is selected, and a channel in the selected reception band can be selected. And, in this instance, since only the tuning circuits 14A to 14C are connected to the high frequency amplifiers 13A to 13C, respectively, the load is light and the high frequency amplifiers 13A to 13C provide low distortion.

[3] EXAMPLES OF THE SWITCH CIRCUIT ACCORDING TO THE PRESENT INVENTION

[3-1] Particular Example

Part 1

Figure 4A:
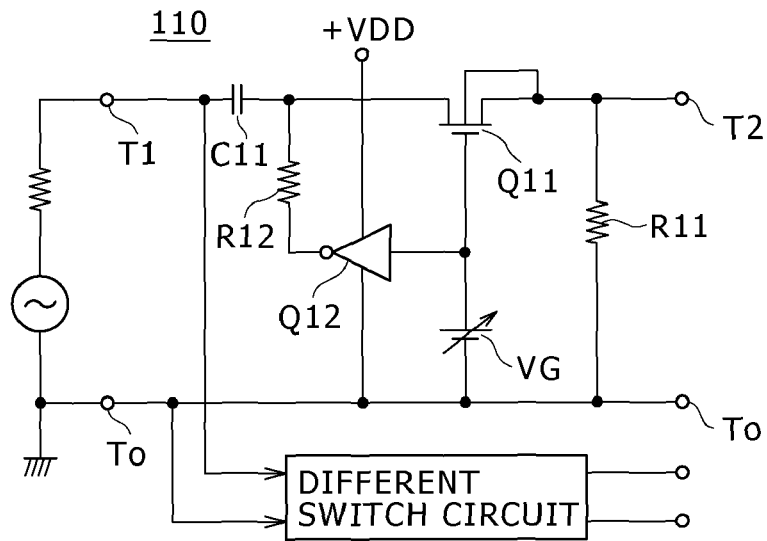
FIG. 4A is a connection diagram (part 1) showing a form of a switch circuit.

FIG. 4A shows an example of a switch circuit 110 according to the present invention. This switch circuit 110 can be used to change the capacitance of the variable capacitors C12A to C12C, C141 to C144, C14B and C14C of the switch circuit 11 or the tuning circuits 12A to 12C and 14A to 14C.

In particular, referring to FIG. 4A, the switch circuit 110 is connected at an input terminal T1 on the hot side thereof to the drain (or source) of a MOS-FET (Q11) of the N channel through a capacitor C11, and the FET (Q11) is connected at the source (or drain) thereof to an output terminal T2 on the hot side. Further, a resistor R11 is connected between the output terminal T2 and a ground terminal T0 and a control voltage VG is supplied to the gate of the FET (Q11), and the FET (Q11) is connected at the back gate thereof to the source (or drain) thereof.

Further, the control voltage VG is supplied to an inverter Q12, and the inverter Q12 is connected at an output terminal thereof to the drain of the FET (Q11) through a resistor R12. It is to be noted that the inverter Q12 is formed from MOS-FETs connected in complementary connection, and a predetermined operating voltage +VDD is supplied thereto. Meanwhile, the capacitor C11 has minimum capacitance which allows an input signal, which is controlled on/off by the switch circuit 110, to pass through the capacitor C11 with minimum loss at the lowest frequency of the input signal. Further, where a signal is distributed by a plurality of switch circuits 110, they are connected in parallel between the terminals T1 and T0.

FIG. 5A shows an example of a structure of the FET (Q11) where the switch circuit 110 is formed in an IC. In particular, the left side of FIG. 5A shows a structure of an N-channel FET while the right side shows a structure of a P-channel FET hereinafter described. In the N-channel FET, an N-type isolation layer 102 is formed like an island on a P-type substrate 101, and a P-type region 103 is formed in the isolation layer 102. Further, at this time, an N+ region 104 is formed in the isolation layer 102, and an reverse bias voltage +VN is supplied to the N+ region 104 such that the P-type region 103 is isolated from the substrate 101.

Further, N+-type regions 105 and 106 are formed in the P-type region 103 and a drain terminal D and an source terminal S are led out, and an insulating layer 107 is formed on the surface between the region 105 and the region 106. A gate electrode 108 is formed on the surface of the insulating layer 107 and a gate terminal G is led out. Further, a P+ region 108 is formed in the region 103, and a back gate terminal BG is led out from this P+ region 108.

Meanwhile, in the P-channel FET, an N-type region 123 is formed on the P-type substrate 101, and P+ type regions 125 and 126 are formed in the N-type region 123 and the drain terminal D and the source terminal S are led out. Further, an insulating layer 127 is formed between the region 125 and the region 126, and a gate electrode 128 is formed on the surface of the insulating layer 127 and the gate terminal G is led out. Further, a P+ region 129 is formed in the N-type region 123, and the back gate terminal BG is led out from the P+ region 129.

With such a configuration as described above, as seen in FIG. 5B, where the control voltage VG is, for example, 3 V, the FET (Q11) is on, and therefore, an input signal supplied to the input terminal T1 is extracted to the terminal T2 through the FET (Q11). It is to be noted that, at this time, since VG=3 V is supplied to the inverter Q12, the output terminal of the inverter Q12 has the ground potential and a resistor R12 is grounded through the inverter Q12.

Figure 4B:
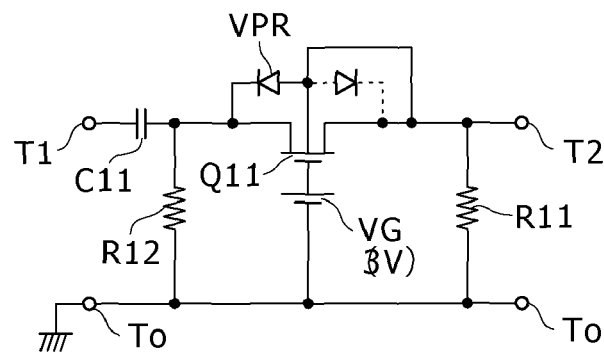
FIG. 4B is a connection diagram (part 2) showing another form of the switch circuit.
Figure 4C:
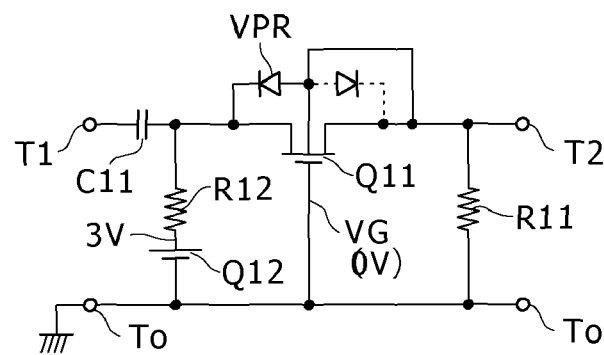
FIG. 4C is a connection diagram (part 3) showing a further form of the switch circuit.

On the other hand, as seen in FIG. 4C, where the control voltage VG is, for example, 0 V, since the FET (Q11) exhibits an off state, an input terminal supplied to the terminal T1 is blocked by the FET (Q11) and is not extracted to the terminal T2.

Figure 5B:
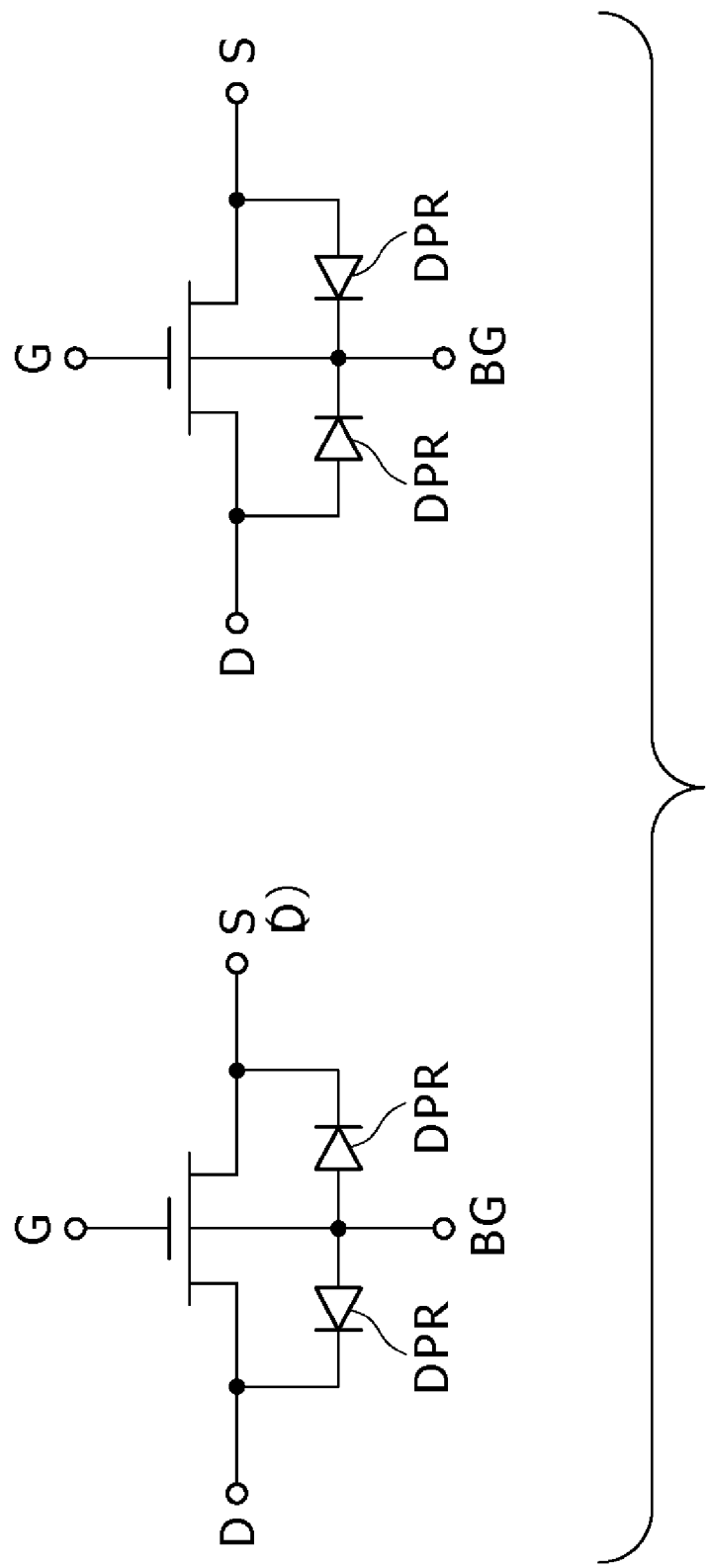
FIG. 5B is a sectional view (part 2) of the IC for explaining the circuits of FIGS. 4A to 4C.

And, in this instance, as shown also in FIG. 5A, since a PN junction is provided between the region 103 and the regions 105 and 106 in the FET (Q11), parasitic diodes DPR, DPR are produced between the back gate and the drain and source as seen in FIG. 5B as described hereinabove. Therefore, where the level of the input signal supplied to the switch circuit 110 is high, the parasitic diodes DPR, DPR are supposed to be turned on.

However, in the switch circuit 110 shown in FIG. 4A, when the FET (Q11) is off, VG=0, and as shown also in FIG. 4C, the potential of the output terminal of the inverter Q12 becomes VG (=3 V), and the resistor R12 is connected here. Accordingly, since the parasitic diode DPR is reversely biased with the control voltage VG (=3 V), even if an input signal of a large amplitude is supplied to the switch circuit 110, the parasitic diode DPR is not turned on at all.

As a result, the input signal to the terminal T1 flows only in a negative half cycle thereof to the parasitic diode DPR and the input signal is not deformed, and therefore, an input signal supplied to another switch circuit is not deformed at all.

It is to be noted that, when the FET (Q11) is on (FIG. 4B), since the parasitic diode DPR is shunted by the on resistance of the FET (Q11), no problem occurs.

In this manner, with the switch circuit 110, when the FET (Q11) is off, the input signal is not deformed, and no problem occurs even where the FET (Q11) is on.

Figure 10:
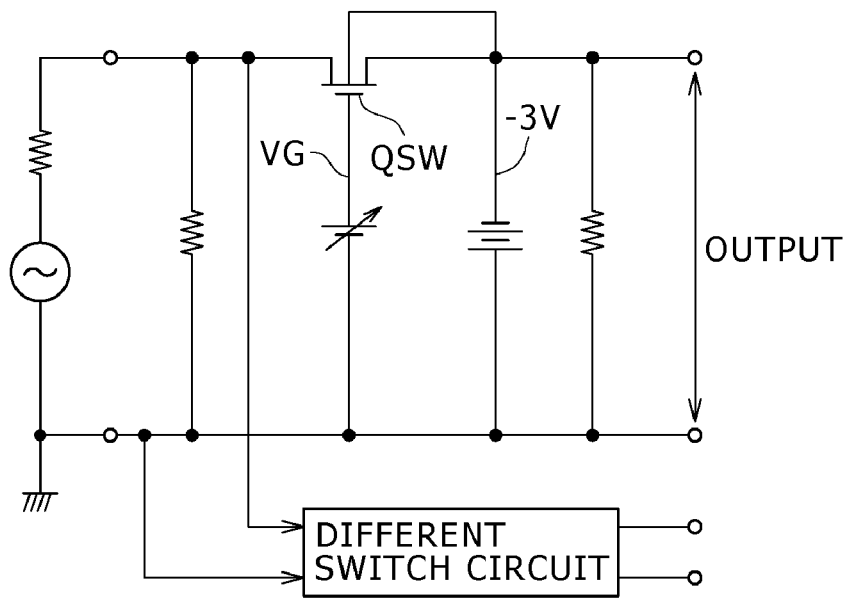
FIG. 10 is a connection diagram (part 1) for explaining the present invention.
Figure 11:
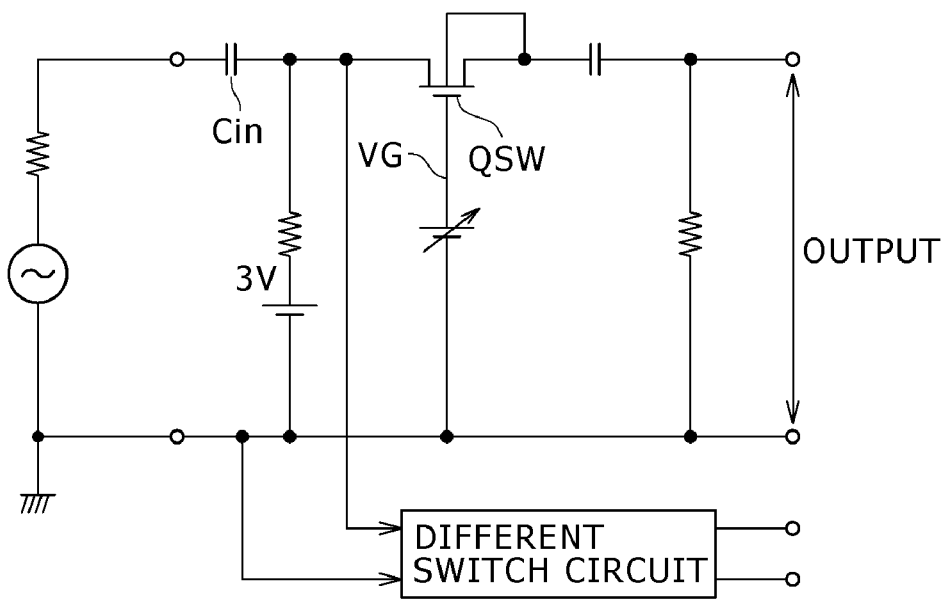
FIG. 11 is a connection diagram (part 2) for explaining the present invention.

Further, a negative bias voltage is not required like the switch circuit of FIG. 10, and there is no necessity to bias the drain or the source of the FET (Q11) in the forward direction from the ground potential to make the back gate to a relatively negative potential. Further, the required voltage may be lower than the operating voltage +VDD of the inverter Q12, and operation with the low voltage is permitted.

[3-2] Particular Example

Part 2

Figure 6:
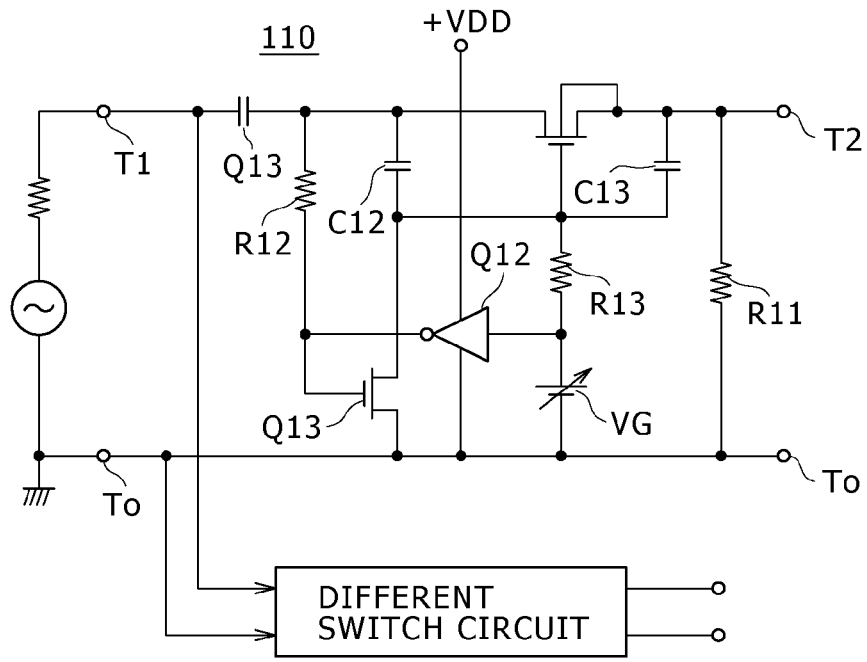
FIG. 6 is a connection diagram (part 1) showing a different form of the switch circuit.

FIG. 6 shows another example of the switch circuit 110 according to the present invention. In this instance, appearance of distortion is suppressed also with an input signal of a greater amplitude.

In particular, in this example, the input terminal T1 is connected to the output terminal T2 on the hot side through the capacitor C11 and further through the drain-source path of the N-channel MOS-FET (Q11), and the resistor R11 is connected to this terminal T2 and the ground terminal T0. Further, the control voltage VG is supplied to the gate of the FET (Q11) through a resistor R13, and the back gate of the FET (Q11) is connected to the source.

Further, the control voltage VG is supplied to the inverter Q12, and the inverter Q12 is connected at an output terminal thereof is connected to the drain of the FET (Q11) through the resistor R12. It is to be noted that the predetermined operating voltage +VDD is supplied to the inverter Q12.

Further, capacitors C12 and C13 are connected to the drain and source and the gate of the FET (Q11), and the inverter Q12 is connected at an output terminal thereof to the gate of an N-channel FET (Q12). The FET (Q13) is connected at the drain thereof to the gate of the FET (Q11) and at the source thereof to the terminal T0.

It is to be noted that the capacitor C11 has minimum capacitance with which an input signal which is controlled on/off by the switch circuit 110 can be passed through the capacitor C11 with minimum loss at the lowest frequency of the input signal.

With such a configuration as described above, the FET (Q11) is controlled on/off with the control voltage VG similarly as in the case of FIG. 4, and the signal of the terminal T2 is controlled on/off in response to the on/off operation.

And, when the FET (Q11) is off, since VG=0, the FET (Q13) is on in response to the output of the inverter Q12, and accordingly, the signal from the capacitor C11 is not outputted to the output terminal T2 at all through the capacitors C12 and C13.

Further, when the FET (Q11) is off, although there is the possibility that an input signal may leak to the output side through junction capacitance between the drain and the back gate, where r13: on resistance of the FET (Q13),
Cd: junction capacitance between the drain and the back gate when the FET (Q11) is off, and RL: impedance of the load to the FET (Q11) if they are set so as to satisfy $$C12 \cdot r13 \approx Cd \cdot RL$$

then the leak signal can be bypassed and the switch circuit 110 can be switched off sufficiently.

On the other hand, when the FET (Q11) is on, since the FET (Q13) is off in response to the output of the inverter Q12, the gate of the FET (Q11) has a potential in ac equal to those of the source and the drain through the capacitors C12 and C13, and accordingly, the on resistance of the FET (Q11) is not varied by an input signal passing therethrough at all but is fixed. Therefore, appearance of distortion can be suppressed. According to an experiment, the distortion factor upon inputting of high power can be reduced to approximately 5 to 8%, and the distortion factor was successfully reduced to ½ in secondary distortion and to approximately ¹⁄₁₀ in tertiary distortion.

It is to be noted that, in this switch circuit 110, only one of the capacitors C12 and C13 may be provided. In this instance, which one of the capacitors C12 and C13 should be connected is determined in accordance with a required performance.

[3-3] Particular Example

Part 3

In the switch circuit 110 of FIG. 6, the resistor R12 becomes part of the load as viewed from the input signal of the terminal T1, and loss occurs. In this instance, the resistor R12 can be ignored if it has resistance equal to approximately 100 times the original load impedance as viewed from the input signal. However, where the input terminals T1 of a large number of switch circuits 110 are connected in parallel, since a large number of resistors R12 are connected in parallel, it is necessary for the resistors R12 to have resistance of a high value. For example, where the input terminals T1 of 10 switch circuits 110 are connected in parallel, it is necessary to set the value of the resistors R12 to approximately 1,000 times the original input impedance of the switch circuits 110. However, where the value of the resistance is set in this manner, the area which the resistors R12 occupy in the IC becomes large, which is disadvantageous.

Figure 7:
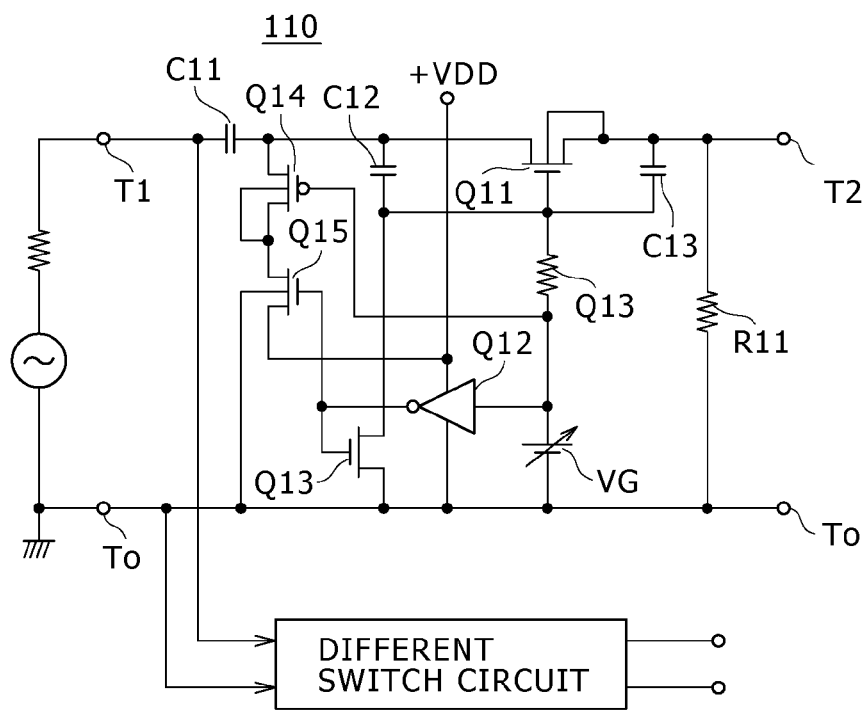
FIG. 7 is a connection diagram (part 2) showing another different form of the switch circuit.

Therefore, in the example shown in FIG. 7, the resistor R12 in the switch circuit 110 of FIG. 6 is implemented by a P-channel MOS-FET (Q14) and an N-channel MOS-FET (Q15).

In particular, in this instance, the FET (Q14) is connected at the drain thereof to the drain of the FET (Q11), and the FET (Q14) is connected at the source and the back gate thereof to the source of the FET (Q15). Further, the FET (Q15) is connected at the drain thereof to the power supply +VDD and at the back gate thereof to the ground terminal T0. Then, the control voltage VG is supplied to the gate of the FET (Q14), and an output of the inverter Q12 is supplied to the gate of the FET (Q15).

With such a configuration as described above, the FET (Q11) is controlled on/off with the control voltage VG similarly as in the case of FIG. 4, and the signal of the terminal T2 is turned on/off in response to the on/off operation of the FET (Q11).

And, when the FET (Q11) is on (when VG=3 V), the FET (Q14) is off in accordance with the control voltage VG and also the FET (Q15) is off in accordance with the output of the inverter Q12. It is to be noted that, as shown also in FIG. 5B, the parasitic diodes DPR, DPR of the FET (Q14) and the FET (Q15) have the opposite polarities to each other, and therefore, even if the amplitude of the input signal is large, they are not turned on at all.

On the other hand, when the FET (Q11) is off (when VG=0), the FETs (Q14, Q15) exhibit an on state reversely to that in the case described hereinabove. However, since the FET (Q11) is on, the source potential of the FET (Q15), that is, the voltage (+VDD−VTH) (VTH is a voltage which depends upon leak current of the circuit), is supplied to the drain of the FET (Q11).

Then, when an input signal is supplied and the drain potential of the FET (Q11) drops within a negative half cycle of the input signal, the FET (Q15) exhibits an on state and the capacitors C11 and C12 and so forth are charged. However, since the FET (Q15) is an N-channel MOS-FET of a small size and operates at a high speed with a high frequency and only leak current of the device becomes a load, distortion which appears in this instance is smaller than the distortion which appears when the parasitic diodes DPR, DPR of the FET (Q11) is turned on.

Accordingly, the input signal can be switched on and off with low distortion without the necessity for the resistor R12 which occupies a large area.

[3-4] Particular Example

Part 4

Figure 8:
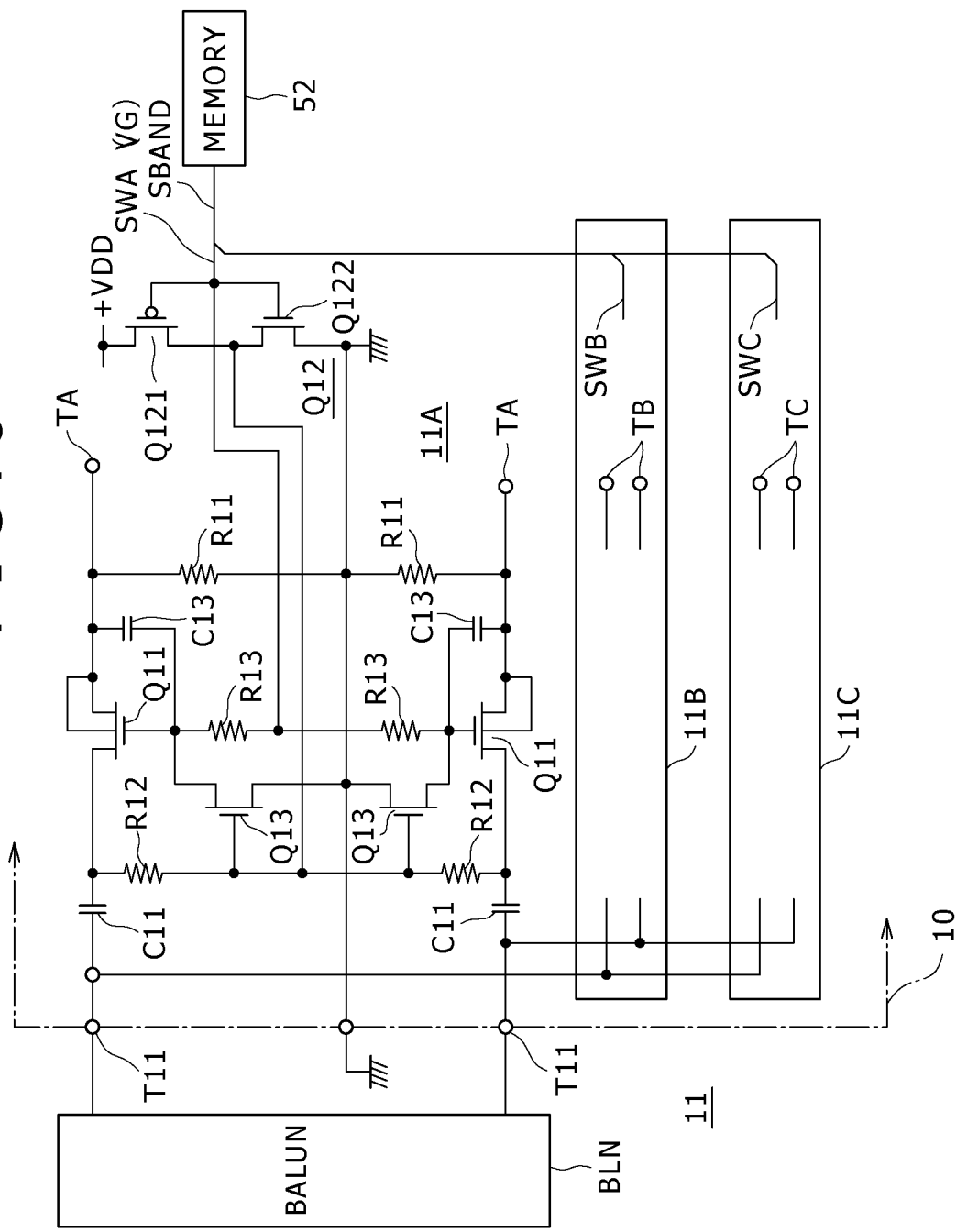
FIG. 8 is a connection diagram (part 3) showing a further different form of the switch circuit.

In FIG. 8, the switch circuit 11 in FIGS. 1 and 3 is implemented by three switch circuits 11A to 11C and the switch circuits 11A to 11C are implemented by the switch circuits 110 described in [3-1] to [3-3], respectively. It is to be noted that, in this example, the switch circuits 11A to 11C (switches 110 to 110) and the signal lines are formed in the balanced type.

In particular, referring to FIG. 8, the terminal pins T11, T11 are connected to the drain (or source) of N-channel FETs (Q11, Q11) through capacitors C11, C11, and the FETs (Q11, Q11) are connected at the source (or drain) thereof to output terminals TA, TA of the switch circuit 11. It is to be noted that the output terminals TA, TA have the antenna tuning circuit 12A connected thereto and are connected to input terminals of the high frequency amplifier 13A as seen in FIG. 3.

Further, resistors R13, R13 are connected in series between the gates of the FETs (Q11, Q11), and the drain-source paths of the N-channel FETs (Q13, Q13) are connected between the gates of the FETs (Q11, Q11) and the ground. Further, the FETs (Q11, Q11) are connected at the back gate thereof to the sources of the FETs (Q13, Q13), and the FETs (Q13, Q13) are connected at the gate thereof to the drains of the FETs (Q11, Q11) through the resistors R12, R12.

Further, the resistors R11, R11 are connected between the sources of the FETs (Q11, Q12) and the ground, and the capacitors C13, C13 of predetermined capacitance are connected between the sources and the gates of the FETs (Q11, Q11).

Further, the switching signal SBAND of the reception band outputted from the buffer memory 52 is formed from switching signals SWA to SWC corresponding to the items (A) to (C) described hereinabove, and the switching signal SWA among them is supplied as the control voltage VG to a connection midpoint of the resistors R11, R11 and is supplied to the gate of the FETs (Q13, Q13) through the inverter Q12 formed from FETs (Q121, Q122) of complementary connection. Further, also the switch circuits 11B and 11C are formed similarly to the switch circuit 11A, and switching signals SWB and SWC are supplied thereto.

It is to be noted that the capacitors C11, C11 have minimum capacitance which allows a reception signal SRX, which is controlled on/off by the switch circuit, to pass through the capacitors C11, C11 with minimum loss at the lowest frequency of the reception signal.

With such a configuration as described above, the FETs (Q11, Q11) of one of the switch circuits 11A to 11C is turned on corresponding to the switching signal SBAND (SWA to SWC) for the reception band outputted from the buffer memory 52 while the FETs (Q11, Q11) of the other switch circuits are turned off. Therefore, the reception signal SRX supplied to the terminal pins T11, T11 is outputted to the output terminal TA, TA to TC or TC corresponding to the switching signal SBAND. Accordingly, the switch circuits 11A to 11C operate as the switch circuit 11 for the reception band, and switching of the reception band is implemented.

And, also where the level of the reception signal SRX is high as described above, an influence of the parasitic diodes DPR, DPR appearing with the FETs (Q11, Q11) can be eliminated.

[3-5] Particular Example

Part 5

Figure 9:
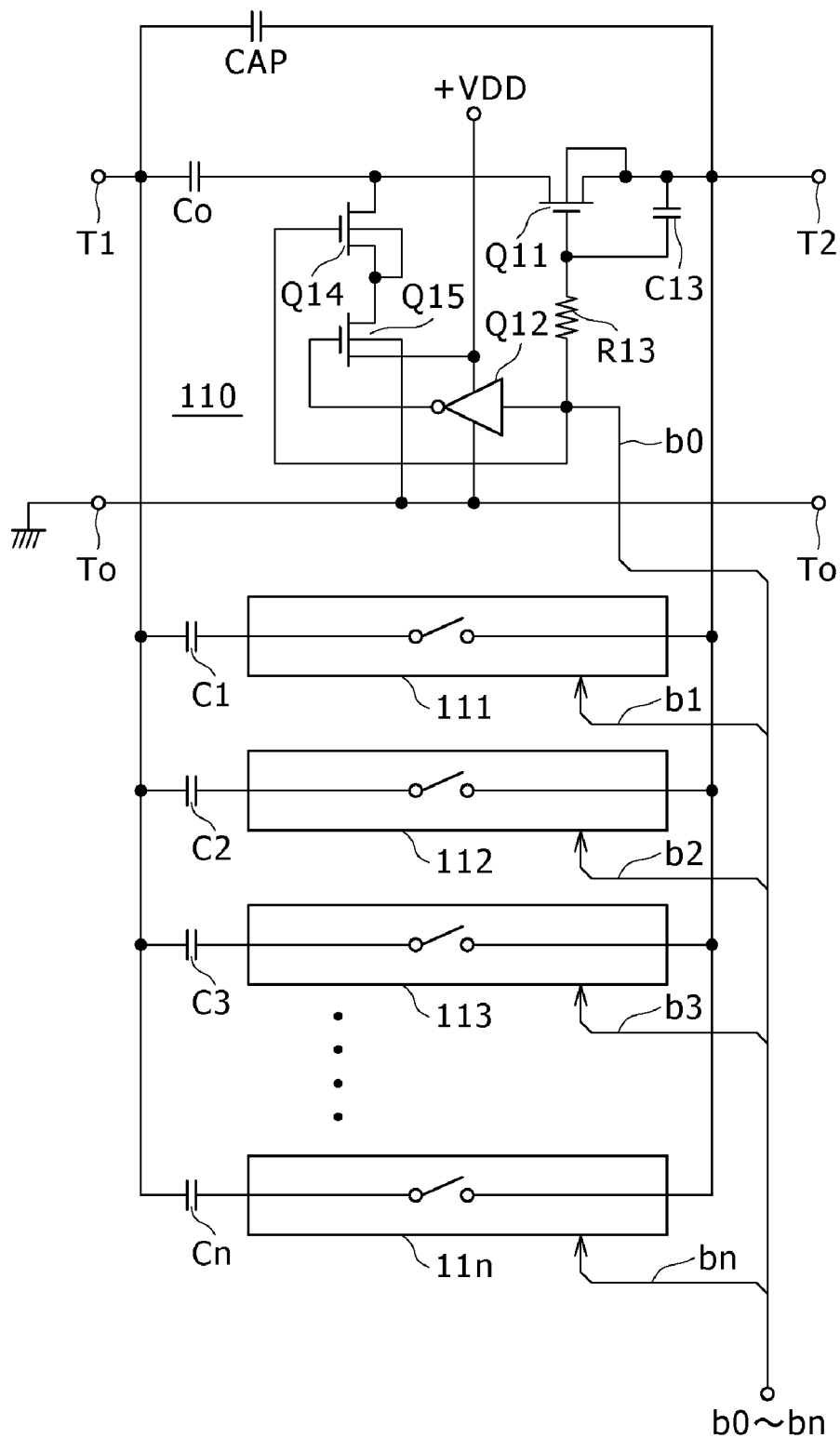
FIG. 9 is a connection diagram showing an application of the switch circuit.

FIG. 9 illustrates a case wherein variation of the capacitance of the tuning capacitors of the tuning circuits 12A to 12C and 14A to 14C by a switch circuit similar to the switch circuit 110 of FIG. 7. It is to be noted that, in this example, the capacitance CVR between the terminal T1 and the terminal T2 can be changed with digital data b0 to bn of (N+1) bits.

In particular, a capacitor CAP is connected between the terminals T1 and T2, and a capacitor C0 and the drain-source of the FET (Q11) are connected in series. This FET (Q11) forms the switch circuit 110 similarly to the switch circuit 110 of FIG. 7, and the LSB (b0) of the digital data for controlling the capacitance CVR is supplied to the gate of the FET (Q11) through the resistor R13. Further, a capacitor C13 of a predetermined value is connected between the gate and the source of the FET (Q11), and the FET (Q11) is connected at the back gate thereof to the source thereof.

Further, a series circuit of the drain-source path of the P-channel MOS-FET (Q14) and the source-drain path of the N-channel MOS-FET (Q15) is connected between the drain of the FET (Q11) and the ground terminal T0. And, the LSB (b0) of the digital data for controlling is supplied to the gate of the FET (Q14), and an output of the inverter Q12 is supplied to the gate of the FET (Q15). It is to be noted that the FET (Q14) is connected at the back gate thereof to the source thereof, and an operating voltage +VDD of the inverter Q12 is supplied to the back gate of the FET (Q15).

The switch circuit 110 is formed in this manner. Further, switch circuits 11*l* to 11*n* are formed similarly to the switch circuit 110, and series circuits of capacitors C1 to Cn and the switch circuits 11*l* to 11*n* are connected in parallel between the terminal T1 and the terminal T2. It is to be noted that the bits b1 to bn (MSB) of the digital data for controlling are supplied to the switch circuits 11*l* to 11*n*, respectively.

Further, in this instance, the values of the capacitors C0 to Cn are set to $$Ci = C0 \times 2^i \quad (8)$$

(i=0 to n)

It is to be noted that, as an example, in the case of the variable capacitor of the tuning circuits 12A to 12C and 14A to 14C, n=8, and in the case of the variable capacitors C31 and C32 of the complex band-pass filter 24, n=7.

With such a configuration as described above, for example, where b0="H" in the switch circuit 110, the FET (Q11) exhibits an on state, and the capacitor C0 is connected between the terminal T1 and the terminal T2. However, when b0="L," the FET (Q11) exhibits an off state, and the capacitor C0 is not connected between the terminal T1 and the terminal T2.

Accordingly, when b0="L,"

$$CVR = CAP$$

but when b0="H,"

$$CVR = CAP + C0$$

And, also in the switch circuits 11l to 11n, similar operation is carried out with the bits b1 to bn. Therefore, if all of the digital data b0 to bn are "H," then $$CVR = CAP + C0 + C1 + C2 + \ldots + Cn$$

Then, since on-off states of the FETs (Q0) to (Qn) exhibit $2^{n+1}$ combinations corresponding to "H" and "L" of bit b0 to bn, the capacitance CVR can vary at $2^{n+1}$ steps in a unit of the capacitor C0 over a range from $$CVR = CAP$$

to $$CTTL = CAP + C0 \times (2^{n+1} - 1)$$

Accordingly, the circuit of FIG. 9 acts as a variable capacitor wherein the capacitance CVR between the terminal T1 and the terminal T2 can be changed to arbitrary capacitance by a necessary variation amount C0 with the digital data b0 to bn. As a result, this circuit can be used as the variable capacitors C12A to C12C, C141 to C144, C14B and C14C for tuning of the tuning circuits 12A to 12C and 14A to 14C. Particularly in the double tuning circuit 14A shown in FIG. 3, although the variable capacitors C143 and C144 for tuning are of the floating type, the circuit of FIG. 9 can cope with this floating.

Further, also in the complex band-pass filter 24, amplitude phase correction circuit 23 and so forth, the circuit of FIG. 9 can be used as a variable capacitor and the characteristic can be set or adjusted with digital data.

[4] CONCLUSION

The switch circuit described above can be concluded in the following manner. In particular, (11) even if an input signal having a large amplitude is supplied, generation of distortion originating from an FET for switching or a parasitic diode can be suppress.

(12) Distortion arising from specific linearity of the on resistance (drain-source resistance) of the FET for switching can be reduced.

(13) Operation with a voltage lower than an operating voltage arising from the withstanding voltage of a MOS-FET is possible, and a high voltage or a voltage of an opposite polarity is not required as a power supply voltage.

(14) When the FET for switching is off, since a high reverse bias is applied to a parasitic diode of the FET, the capacitance decreases.

(15) Since the input capacity is small, even where a plurality of switch circuits are connected in parallel to selectively distribute a high frequency signal, the influence of the parallel connection is low.

(16) Also where a large number of switch circuits are connected in parallel to form a switching circuit as an IC, a very large area is not required, and an input signal can be selectively distributed to a plurality of circuits readily.

(17) Since distortion of odd-numbered orders can be suppressed, tertiary intermodulation distortion becomes small, and since also the parasitic capacitance is low, the switch circuit is suitable for a distribution circuit of a high frequency signal.

[5] OTHERS

In the foregoing, also it is possible to use the local oscillation signals SLOI and SLOQ and the complex band-pass filter 24 to set the phase of the intermediate frequency signal components of the reception signal SRX in the signals SIFI and SIFQ opposite to each other and set the phases of the intermediate frequency signal components of the image interfering signal SUD same to each other. In this instance, if subtraction between the signal SIFI and the signal SIF1 is carried out, then the intermediate frequency signal SIF of the reception signal SRX can be obtained.

In particular, a phase relationship between the local oscillation signals SLOI and SLOQ and phase shifting of the complex band-pass filter 24 should be set in the signals SIFI and SIFQ such that the intermediate frequency signal components in the reception signal and the intermediate frequency signal components in the image interfering signal may have phases opposite to each other to carry out addition or subtraction of the signals SIFI and SIFQ.

Further, also it is possible to reverse the connection positions of the complex band-pass filter 24 and the amplitude phase correction circuit 23.

Further, if an amplifier 25 subtracts the expression (6) from the expression (5), then $$SIF = SIFI - SIFQ \qquad (9)$$
$$= 2\beta \cdot \cos\omega IFt$$
$$= EUD \cdot ELO \cdot \cos\omega IFt$$

and the image interfering signal SUD can be extracted. Consequently, the amplitude phase correction circuit 23 can correct the amplitude and the phase of the signals SIFI and SIFQ so that the image interfering signal SUD may be minimized.

LIST OF ABBREVIATED WORDS

A/D: Analog to Digital
AGC: Automatic Gain Control
D/A: Digital to Analog
D/U: Desire to Undesire ratio
FET: Field Effect Transistor
IC: Integrated Circuit
LSB: Least Significant Bit
MOS: Metal Oxide Semiconductor
MSB: Most Significant Bit
NTSC: National Television System Committee
PAL: Phase Alternation by Line
PLL: Phase Locked Loop
SECAM: Sequential a Memoire Color Television System
VCO: Voltage Controlled Oscillator

The invention claimed is:

1. A switch circuit, comprising:
a first terminal connected to one side of a MOS-FET through a capacitor;
a second terminal connected to a side of the MOS-FET opposite the first terminal and also connected to a back gate of the MOS-FET, wherein,
 a control voltage is supplied to a gate of the MOS-FET,
 a voltage having a polarity reversed from that of the control voltage is supplied to the side of the MOS-FET connected to the first terminal through a resistance element,
 the control voltage is supplied to the gate through a different resistance element, and
 a different capacitor is connected between the gate and at least one of the first side and the second side of the MOS-FET.

2. The switch circuit according to claim 1, wherein said switch circuit further comprises a different FET which connects the gate of the MOS-FET to the ground when the MOS-FET is off.

3. The switch circuit according to claim 1, wherein the relationship is set to $C12 \cdot r13 \approx Cd \cdot RL$, where
 C12: capacitance of the different capacitor,
 r13: on-resistance of the different FET,
 Cd: connection capacitance between the drain and the back gate of the MOS-FET when the MOS-FET is off, and
 RL: impedance of the load to the MOS-FET.

4. The switch circuit according to claim 1, wherein said resistance element is a pair of FETs connected in complementary connection to each other.

5. An IC, comprising:
a plurality of switch circuits, each switch circuit having a first terminal connected to one side of a MOS-FET through a capacitor;
a second terminal connected to a side of the MOS-FET opposite the first terminal and also connected to a back gate of the MOS-FET,
 wherein,
  a control voltage is supplied to a gate of the MOS-FET,
  a second voltage having a polarity reversed from that of the control voltage is supplied to the one sided of the MOS-FET through a resistance element,
  the control voltage is supplied to the gate of the MOS-FET through a different resistance element,
  a different capacitor is connected between the gate and at least one of the first side and the second side of the MOS-FET,
  the first terminals of each switch circuit are connected commonly, and
 the control voltages in the switch circuits are switched such that a signal inputted to the first terminal is selectively outputted to the second terminals of each of the switch circuits.

6. A variable capacitor circuit, comprising:
a plurality of switch circuits, each each switch circuit having a first terminal connected to one side of a MOS-FET through a capacitor;
a second terminal connected to the opposite side of the MOS-FET as the first terminal and also to the back gate of the MOS-FET,
 wherein,
  a control voltage is supplied to a gate of the MOS-FET; and that
  a second voltage having a polarity reversed from that of the control voltage is supplied to the one sided of the MOS-FET through a resistance element, connected in parallel between the first terminal and the second terminal,
  the control voltage is supplied to the gate through a different resistance element,
  a different capacitor is connected between the gate and at least one of the first side and the second side of the MOS-FET,
  the control voltages in each of the switch circuits switch the capacitance between the first terminal and the second terminal.

7. The variable capacitor circuit according to claim 6, wherein the value of the capacitor is doubled for each of the switch circuits.

* * * * *